United States Patent
Dubois et al.

(10) Patent No.: US 12,557,699 B2
(45) Date of Patent: Feb. 17, 2026

(54) POWER COMPONENT WITH LOCAL FILTERING

(71) Applicant: THALES, Courbevoie (FR)

(72) Inventors: Eric Ravindranath Dubois, Chatou (FR); Hocine Kherbouchi, Chatou (FR); Jean-Paul Berger, Chatou (FR)

(73) Assignee: THALES, Courbevoie (FR)

( * ) Notice: Subject to any disclaimer, the term of this patent is extended or adjusted under 35 U.S.C. 154(b) by 586 days.

(21) Appl. No.: 17/895,814

(22) Filed: Aug. 25, 2022

(65) Prior Publication Data
US 2023/0075386 A1   Mar. 9, 2023

(30) Foreign Application Priority Data
Aug. 26, 2021   (FR) ...................... 2108957

(51) Int. Cl.
*H01L 25/07* (2006.01)
*H01L 23/36* (2006.01)
*H10D 1/20* (2025.01)

(52) U.S. Cl.
CPC ............ *H01L 25/072* (2013.01); *H01L 23/36* (2013.01); *H10D 1/20* (2025.01)

(58) Field of Classification Search
CPC . H01L 25/04–074; H01L 25/065–0657; H01L 2023/4062; H01L 2023/405;
(Continued)

(56) References Cited

U.S. PATENT DOCUMENTS

2006/0284211 A1* 12/2006 Takubo ................ H01L 25/072
257/E25.031
2016/0155706 A1   6/2016 Yoneyama et al.
(Continued)

FOREIGN PATENT DOCUMENTS

EP    2 887 519 A2    6/2015
JP    2020188351 A  * 11/2020

OTHER PUBLICATIONS

English translation of JP-2020188351-A (Year: 2020).*
(Continued)

*Primary Examiner* — Dale E Page
*Assistant Examiner* — Douglas Yap
(74) *Attorney, Agent, or Firm* — BakerHostetler

(57) ABSTRACT

A switching component configured to switch an electrical signal, the switching component includes a substrate bearing several elementary components each ensuring the switching of the electrical signal, a baseplate onto which the substrate is fixed, the baseplate being configured to discharge heat emitted in the switchings of the switching component, two electrical conductors each connected to one of the elementary components and respectively ensuring the input and the output of the elementary component concerned for the signal ($I_C$) to be switched, a magnetic core produced in a ferromagnetic material, the magnetic core surrounding the elementary component concerned without surrounding others of the elementary components and being disposed in the component in such a way that a displacement current between the surrounded elementary component and the baseplate induces a magnetic induction in the magnetic core, and in such a way that the path followed by a conduction current of the electrical signal switched by the component does not form a turn around the magnetic core.

8 Claims, 2 Drawing Sheets

(58) Field of Classification Search
CPC ......... H01L 2023/4037; H01L 21/4882; H01L 21/4871; H01L 23/36; H01L 23/367; H01L 23/645; H01L 2924/13055; H01L 21/56; H01L 23/053–057; H01L 23/42; H01L 23/16; H01L 23/315; H01L 23/12–15; H01K 2201/066; H10D 84/101–161; H10D 84/40–409; H10D 84/0123–0195; H10D 1/20; H03F 2203/45; H02M 1/12; H02M 1/123; H02M 1/007; H02M 7/5387

See application file for complete search history.

(56) References Cited

U.S. PATENT DOCUMENTS

| | | |
|---|---|---|
| 2017/0012593 A1 | 1/2017 | Tanimizu et al. |
| 2018/0122746 A1 | 5/2018 | Ngo et al. |
| 2019/0098777 A1* | 3/2019 | Nakatsu ............... H02M 1/327 |
| 2021/0159718 A1* | 5/2021 | Gaulke ............... H01F 1/15333 |

OTHER PUBLICATIONS

"Solutions for measuring permittivity and permeability with LCR meter and impedance analyzers", Keysight, Aug. 3, 2014. https://www.keysight.com/fr/en/assets/7018-06683/application-notes/5980-2862.pdf.

Barba, et al., "Magnetic complex permeability (imaginary part) dependence on the microstructure of a Cu-doped Ni-Zn-polycrystalline sintered ferrite", Ceramics International, vol. 46, Issue 10, Part A, pp. 14558-14566, Jul. 2020.

* cited by examiner

POWER COMPONENT WITH LOCAL FILTERING

CROSS-REFERENCE TO RELATED APPLICATION

This application claims priority to foreign French patent application No. FR 2108957, filed on Aug. 26, 2021, the disclosure of which is incorporated by reference in its entirety.

FIELD OF THE INVENTION

In power electronics, many solid-state converters have been developed, primarily inverters and rectifiers. There are also more complex equipment such as switched mode power supplies. These converters are equipped with electronic components that make it possible to switch an electrical signal. The switching components are often called "electronic switches". Among these components there are diodes, transistors, thyristors, triacs, etc.

BACKGROUND

Power diodes have been developed since the 1950s. In the 1960s, thyristors and power transistors emerged. Later, in the 1980s, insulated gate bipolar transistors emerged, better known by the acronym IGBT. This type of transistor combines the benefit of control by means of a field-effect transistor and the low conduction losses of a bipolar transistor. Currently, the IGBTs can be used to switch powers of the order of 10 MW at speeds greater than 10 kHz. For lower powers, MOSFET transistors are also widely employed. In the 2000s, components and notably MOSFET transistors, based on silicon carbide (SiC), emerged. They allow speeds greater than 1 MHz to be achieved. More recently, gallium nitride GaN has also been introduced into the MOSFET transistors to produce electronic switches. Gallium nitride makes it possible to raise the switching speed further to frequencies greater than 10 MHz.

In switching power electrical signals, these components generate thermal losses that must be discharged. The cooling of the electronic switches is most often performed by means of heat sinks that make it possible to discharge the heat by air convection along the walls of the heat sink. The heat sinks can also be equipped with channels in which a refrigerant circulates.

To ensure a good heat transfer from the component to its heat sink, it is necessary to minimize the thermal resistance of the path travelled by the heat from its zone of emission at the core of the component to the heat sink allowing this heat to be dissipated. The electronic switch most commonly has a metal baseplate disposed in immediate proximity to the core of the component and through which the heat to be discharged passes. The baseplate can be electrically insulated from the component or form one of its connection points. When the electronic switch is being mounted, the baseplate is pressed against the heat sink. The contact of the baseplate on the heat sink can be thermally enhanced by means of a thermally conductive paste. It is also possible to interpose an electrical insulation between the baseplate and the heat sink in the form of a wafer based on aluminium oxide, mica or silicone.

The safety of the users of equipment implementing electronic switches generally requires an electrical grounding of the heat sinks. For better dissipation of the heat, it is even possible to use the outer package of the equipment as heat sink. This all the more increases the need to connect the package to the electrical ground of the system comprising the equipment.

FIG. 1 represents an electrical architecture 10 comprising two solid-state converters: a rectifier 12 and an inverter 14. The electrical architecture 10 is well suited to equipping a vehicle, notably an aircraft. The electrical architecture 10 comprises an AC network 16 allowing a load 18, such as an engine for example, to be powered through the rectifier 12, generating a DC voltage from the AC voltage deriving from the AC network 16, and through the inverter 14 supplying an AC voltage to the load 18 from the DC voltage.

In FIG. 1, the electrical architecture 10 is represented schematically. In practice, the DC voltage can form a network allowing a large number of loads to be powered, each able to operate with a different AC voltage. It is possible to adapt the frequency of the AC voltage to the need of the load. It is for example possible to modulate the speed of the engine by varying the frequency by means of the inverter 14. Several inverters can power one and the same load. The electrical architecture 10 can be reconfigurable in real time. It allows a load to be powered by means of as many converters as necessary as for example described in the patent application published under the number EP 2 887 519 A2 and filed in the name of the applicant.

Common-mode disturbances can circulate in the electrical architecture 10. These disturbances, represented by thick dotted lines in FIG. 1, circulate primarily through an electrical ground 20 of the electrical architecture 10. Since the AC network 16 is linked to the ground 20, the disturbances are superimposed on the AC voltages of the AC network 16 then on the DC voltages from the rectifier 12.

The common-mode disturbances can be limited by means of inductive filters disposed for example on the DC network. As illustrated in FIG. 1, a common-mode filter 22 comprises two inductors disposed on one and the same magnetic core. One phase of the DC network circulates in each of the inductors. The inductors are produced by means of electrical conductors wound on the common magnetic core. The electrical conductors forming the inductors are dimensioned to withstand the useful current of the DC network. Because of this, the conductor sections are significant. The magnetic core on which the conductors are wound is also bulky. This results in a significant weight and volume for the filter 22.

Moreover, the electronic switches of the converters have a stray capacitance 24 formed between the conduction channel of the switch, the baseplate and the heat sink. This capacitance 24 is due to the proximity between the conduction channel, the baseplate and the heat sink, a proximity made necessary for the discharging of the heat given off in the switchings.

In-house trials have shown that the common-mode disturbances tend to be propagated through the stray capacitances 24 of the electronic switches to reach the electrical ground 20. In FIG. 1, only the stray capacitances 24 of the electronic switches of the inverter 14 are represented. The diodes of the rectifier 12 can also have the same type of stray capacitance, whenever one of their electrodes is disposed in proximity to or in contact with a mechanical part linked electrically to the electrical ground 20. The currents forming the common-mode disturbances are all the greater when the switching frequency increases. With the implementation of electronic switches able to achieve extremely short switching times, the disturbance currents become an increasing preoccupation. Because of their volume and their weight, the current solutions used to reduce the disturbances, notably the common-mode currents, are difficult to implement with the new generations of electronic switches.

There are switching packages comprising different types of elementary switching components, such as, for example, an inverter package comprising several transistors each associated with a flyback diode. It is possible to limit the disturbances of this package by means of a magnetic core surrounding all of the package. The applicant has noted that this disposition of the magnetic core lacks adaptation to each of the elementary components. Furthermore, should one of the elementary components fail resulting in an overcurrent passing through it, the magnetic core can saturate and no longer fulfil its function with respect to the other elementary components. To limit the risk of saturation, it is possible to increase the dimensions of the magnetic core. However, this increase in dimensions tends to increase the bulk, the weight and the cost of the magnetic core.

SUMMARY OF THE INVENTION

The invention proposes a solution to these problems by filtering at source the currents that can flow in the stray capacitances of the electronic switches. The filtering proposed by the invention is done as close as possible to each elementary component.

To this end, the subject of the invention is a switching component configured to switch an electrical signal, the switching component comprising:

- a substrate bearing several elementary components each ensuring the switching of the electrical signal,
- a baseplate onto which the substrate is fixed, the baseplate being configured to discharge heat emitted in the switchings of the switching component,
- two electrical conductors each connected to one of the elementary components and respectively ensuring the input and the output of the elementary component concerned for the signal to be switched,
- a magnetic core produced in a ferromagnetic material, the magnetic core surrounding the elementary component concerned without surrounding others of the elementary components and being disposed in the component in such a way that a displacement current between the surrounded elementary component and the baseplate induces a magnetic induction in the magnetic core, and in such a way that the path followed by a conduction current of the electrical signal switched by the component does not form a turn around the magnetic core.

By surrounding the elementary component concerned by means of a magnetic core, and possibly several elementary components by means of several mutually independent cores, the filtering can be best matched to the elementary component concerned. It is possible to produce the magnetic core by surrounding the component concerned as closely as possible. The magnetic length of the magnetic core is thus reduced, which makes it possible to enhance the efficiency thereof. When the component comprises several elementary components, it is possible to choose, from among the elementary components, that or those surrounded by a magnetic core. When several magnetic cores are present, each associated with an elementary component, the independence of the different magnetic cores first of all makes it possible to determine the characteristics thereof independently: choice of ferromagnetic material and dimensioning.

Advantageously, the magnetic core is produced in a ferromagnetic material having an imaginary part of relative magnetic permeability greater than 10.

Advantageously, the magnetic core is produced in a nanocrystalline ferromagnetic material.

The magnetic core can comprise a central void surrounding the elementary component.

The magnetic core can be closed, that is to say without air gap, or open, that is to say with at least one air gap.

Alternatively to the presence of a central void, the magnetic core can be in the form of a plate disposed under the substrate.

BRIEF DESCRIPTION OF THE DRAWINGS

The invention will be better understood and other advantages will emerge on reading the detailed description of an embodiment given as an example, the description being illustrated by the attached drawing in which.

In the interests of clarity, the same elements will bear the same references in the different figures.

DETAILED DESCRIPTION

Figure 2:
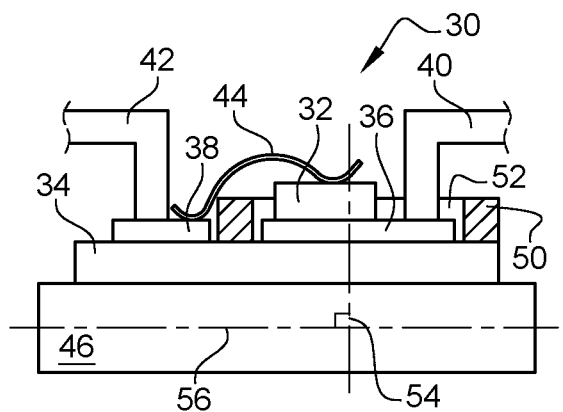
FIG. 2 represents a first example of placement of a magnetic core inside a switching component.

FIG. 2 represents in cross-section a switching component 30 comprising a semiconductor-based elementary component 32. Any kind of elementary component can be implemented in the context of the invention. The elementary component can be a natural switching component like a diode or a controlled switching component such as a thyristor or a transistor. Currently, many materials are implemented to produce elementary switching components, notably silicon, germanium, gallium arsenide, silicon carbide, gallium nitride. The invention can be implemented regardless of the semiconductor material implemented.

FIG. 2 schematically represents the component 30 in cross-section. The elementary component 32 in the form of a chip is deposited on an insulating substrate 34, for example of ceramic. A metallization selectively covers the substrate 34 and makes it possible to electrically connect the elementary component 32. The metallization here comprises two parts 36 and 38. The part 36 receives a pin 40 and the part 38 receives a pin 42. The part 36 extends under the elementary component 32 and forms a first electrode of the component 30. The part 38 is electrically connected to the top part of the elementary component 32 by means of one or more metal legs 44 forming a second electrode of the component 30. An electrical signal can circulate between the two pins 40 and 42 depending on the state of the junction in the semiconductor forming the elementary component 32. For a natural switching component, the potential difference between the two pins 40 and 42 determines the state of the junction, and for a controlled switching component, a control electrode, not represented in FIG. 2, allows the switching to be triggered by switching the junction from an off state to an on state. The control electrode can be linked to another part of the metallization by means of another leg not situated in the cutting plane of FIG. 2.

Figure 1:
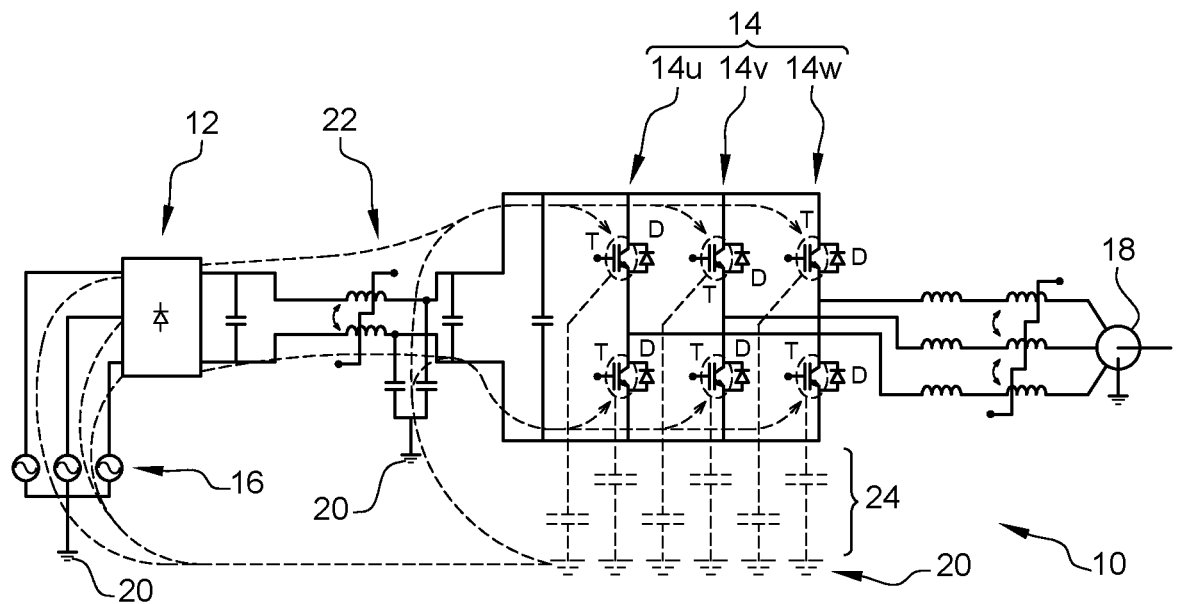
FIG. 1, already described, represents an electrical architecture in which the invention can be implemented.

In its operation, the component 30 gives off heat forming losses that must be discharged. This heat is primarily given off in the switchings and when the junction is on because of its internal resistance. The heat generated in the elementary component 32 is primarily drained to a baseplate 46 onto which the substrate 34 is fixed. The baseplate 46 is for example produced in a metal alloy for its good capacity to conduct heat. The baseplate 46 can for example be produced in a copper or aluminium alloy. The baseplate 46 can be fixed to a heat sink, not represented in FIG. 1, and allowing the heat to be discharged. The discharging can be done into the ambient air by natural or forced convection. The discharging can also be done by means of channels circulating in the heat sink and in which a heat-transfer fluid circulates. The dimensioning of the heat sink is done as a function of the heat generated by the component 30 in its use and, for discharging by convection, as a function of the ambient medium in which the heat sink is immersed. It is common practice to connect the heat sink to the electrical ground of the equipment in which the component 30 is implemented, for example a converter 12 or 14 as represented in FIG. 1.

As described above, a stray capacitance is formed between, on the one hand, the elementary component 32 and/or the part 36 of the metallization, and, on the other hand, the baseplate 46, the substrate 34 forming a dielectric for this stray capacitance. Another stray capacitance is formed in the elementary component 32 itself between its electrodes. A displacement current can form between the junction and the baseplate 46 through the stray capacitance. This current can be all the greater as the switching speed increases. In practice, in a switching, the current circulating in the junction is established or interrupted forming a current step in a timing diagram. The applicant has noted that the repetition of these current steps generates not inconsiderable leak currents circulating in the electrical ground of the system through the stray capacitance of the component 30. The invention seeks to limit the current circulating in this stray capacitance by means of a magnetic core 50 surrounding the elementary component 32.

The current circulating in the stray capacitance, called displacement current, passes through the central void 52 of the magnetic core 50 which thus forms an inductor tending to oppose the establishing of this current. To avoid the magnetic core from being subjected to the useful signal switched by the component and circulating between the two pins 40 and 42, the magnetic core 50 is disposed in the component in such a way that the path followed by the current, called conduction current, of the useful signal does not form a turn around the magnetic core 50. More specifically, the useful current circulates between the two pins 40 and 42 in passing through the part 36 of the metallization, the junction of the elementary component 32, the leg 44 and the part 38 of the metallization. This path can partly penetrate into the central void 52 and re-emerge therefrom on the same side of the magnetic core 50 without forming a turn wound around the magnetic core 50. Such a production is well suited to components 30 in which the pins 40 and 42 are disposed on a same side of the baseplate 46.

Figure 3:
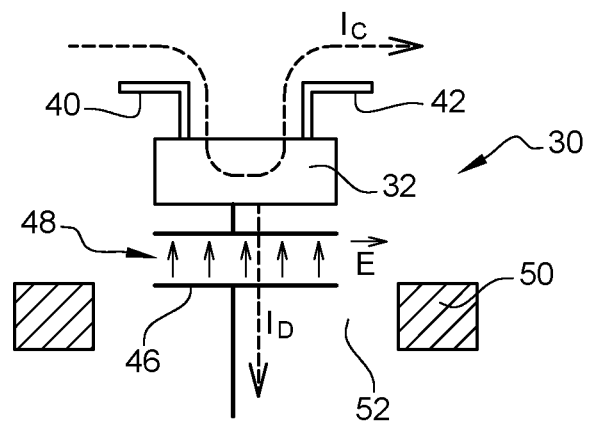
FIG. 3 schematically represents the circulation of currents in the component represented in FIG. 2.

FIG. 3 schematically represents the circulation of currents in the component represented in FIG. 2. The conduction current $I_C$ forming the switched electrical signal circulates between the pins 40 and 42 via the junction formed in the elementary component 32. The stray capacitance or capacitances formed in the component 30 or outside the latter bear the reference 48. In these capacitances, an electrical field $\vec{E}$ appears and its temporal variation induces a displacement current $I_D$ which is looped back in the electrical architecture 10 incorporating the component 30. In practice, the displacement current $I_D$ essentially forms the disturbances represented by thick dotted lines in FIG. 1. The displacement current $I_D$ is looped back by one or both of the pins 40 and 42. The displacement current $I_D$ is superimposed on the useful current switched by the component and called conduction current $I_C$. The value of the displacement current $I_D$ can exceed a percent of the value of the conduction current $I_C$. As described above, the greater the switching speed of the component, the more the value of the displacement current $I_D$ increases. By disposing the magnetic core 50 in such a way that the displacement current $I_D$ passes through the central void 52, the path followed by the displacement current $I_D$ forms a turn around the magnetic core 50 because of the loop back of this current. In practice, the current called displacement current is established between the armatures of a capacitance in the absence of support in the form of an electrical conductor. Beyond the armatures, this current is conducted by different electrical conductors and notably the baseplate 46. It should therefore also be qualified as conduction current. For simplicity, and to distinguish it from the useful current switched by the component and called conduction current, the current that is established through the stray capacitances 48 of the component 30 will be called hereinafter displacement current even when it is borne by electrical conductors upstream or downstream of the stray capacitances 48. The magnetic core 50 can be disposed precisely by surrounding the stray capacitance or capacitances 48 of the component 30. The magnetic core can also be disposed upstream or downstream of these stray capacitances on the path followed by the displacement current $I_D$ even when the latter is borne by an electric conductor. That offers a benefit, notably when it is impossible to accurately determine where all the stray capacitances of the component 30 are situated. It is however advantageous to dispose the magnetic core in the component 30, or in immediate proximity thereto, as will be seen later in order to better control the electrical conductors likely to carry the displacement current. That notably makes it possible to allow the component 30 to fix its baseplate 46 on any type of support, notably made of materials that conduct electricity and that are likely to have the displacement current $I_D$ pass through them when it is looped back.

It is possible to implement a magnetic core 50 that is closed without air gap. Many manufacturers call this type of core a "toroidal core". It is formed around a central void. The qualification toroidal for the magnetic core goes well beyond the mathematical definition of a torus. There are notably magnetic cores that are called toroidal with circular, rectangular and other sections. To equip the component 30, the form of the section of the magnetic core 50 is adapted to the shape of the elementary component 32 and to that of the part 36 of the metallization.

Alternatively, it is possible to implement a magnetic core that is open, that is to say with air gap, in other words partially surrounding the elementary component 32. An air gap makes it possible to adapt the characteristics of the magnetic core 50 to the filtering that is wanted to be produced. An air gap notably makes it possible to increase the maximum value of a displacement current passing through the magnetic core before saturation of the magnetic core. In practice, it is possible to provide one or more air gaps in the form of the magnetic core 50. As a variant, the air gap or the air gaps can be partial, for example produced in the form of notches, or complete, that is to say cutting right through the magnetic core.

In order to allow the optimum effect of the magnetic core 50 on the displacement current $I_D$ that can circulate in the stray capacitances of the component 30, the magnetic core 50 extends around an axis 54 that is substantially at right angles to the plane 56 in which the baseplate 46 extends. In practice, the baseplate 46 can be considered as one of the conductive armatures of the stray capacitance or capacitances of the component 30 and the displacement current $I_D$ circulates mostly at right angles to this armature. In practice, the effect of the magnetic core 50 on the displacement current $I_D$ appears when the axis 54 is not parallel to the plane of the baseplate 46.

The magnetic core 50 is produced in a ferromagnetic material. Ideally, material with high relative permeability is chosen. The maximum relative permeability, usually denoted $\mu_r$, links in a linear domain the magnetic field B and the magnetic excitation field H induced by the displacement current. It is generally considered that the materials with high relative permeability have a value $\mu_r$ greater than 30 000. The maximum relative magnetic permeability can be measured for a magnetic excitation of 100 mA/cm at a frequency of 10 kHz. Many manufacturers of magnetic materials show in their catalogue the maximum relative permeability value with a tolerance of +/−15%. This type of measurement with its tolerance can be taken into account in the context of the invention.

The magnetic cores are usually used with turns of electrical conductors wound around the magnetic cores and in which an electric current circulates. In the context of the invention, the magnetic core 50 is used without turns of electrical conductor passing through the central void 52. However, a variable electrical field can be established in the central void 52 or in the extension thereof along the axis 54. The fourth Maxwell equation, also called Ampere-Maxwell law, states that the curl of the magnetic induction $\vec{H}$ is proportional to the current density $\vec{J}$ in a conductor and to the time variation of the electrical field $\vec{E}$.

$$\vec{\nabla} \wedge \mu\vec{H} = \frac{1}{c}\left(4\pi\vec{J} + \frac{\partial \vec{E}}{\partial t}\right)$$

In the invention, in the absence of an electrical conductor passing through the central void 52, the conduction current represented by the vector $\vec{J}$ is nil. Only the time variation of the electrical field $\vec{E}$ in the stray capacitances of the component 30 are of interest. This time variation generates a displacement current $I_D$. According to the third Maxwell equation, also called Faraday's law, the time variation of magnetic induction $\vec{H}$ in the magnetic core 50 induces an electrical field $50 \; \vec{E1}$ opposite the electrical field $\vec{E}$ generated by the displacement current $I_D$ circulating in the stray capacitance.

$$\vec{\nabla} \wedge \vec{E1} = -\mu\frac{\partial \vec{H}}{\partial t}$$

The opposite electrical field tends to oppose the establishing of the leak currents by the stray capacitance. In a first approach, this opposition can be modelled by an inductor connected in series with the stray capacitance of the component 30. The value of the inductor is all the greater when the maximum relative permeability of the magnetic core 50 is high. In fact, in the two Maxwell equations cited above, the magnetic permeability $\mu$ of the medium appears. This permeability is equal to the product of the permeability of the vacuum $\mu_0$ by the relative permeability $\mu_r$ of the medium, close to 1 for air and much greater for a magnetic core made of ferromagnetic material. To retain a high inductance value, the magnetic core 50 must remain in its linear domain and avoid being saturated. In fact, upon saturation, the relative permeability decreases to become equal to 1. In other words, a strongly saturated magnetic core has practically no influence on the magnetic field that it generates as a function of the induction that it receives. To limit the risks of saturation of the magnetic core 50, any electrical conductor forming a turn around the magnetic core 50, and notably a turn that can be formed by the path followed by the current circulating between the pins 40 and 42, is avoided. More specifically, the elementary component 32 can be situated inside the central void. However, the input and the output of the current in the elementary component 32 must be through a same side of the central void 52, for example through the top as represented in FIG. 2.

Among the known ferromagnetic materials, to produce the magnetic core 50, it is possible to implement materials formed by alloys containing mostly iron and nickel. These materials appeared at the start of the 20th century and are notably known as "Permalloy" and "Mu-metal". These materials are crystalline and, to achieve good magnetic properties, heat treatments are necessary, a treatment tending to increase the dimensions of the crystalline grains. This increase in grain size tends to degrade the mechanical properties of these alloys rendering them difficult to shape.

Amorphous materials were then developed in order to facilitate the implementation of the ferromagnetic materials. However, the presence of amorphizing elements, such as boron for example, tends to limit the induction at saturation. Furthermore, significant magnetic losses appear in uses at high frequency.

Toward the end of the 20th century, a new family of nanocrystalline materials was developed, notably by the company Arcelor-Mittal Imphy and known as "Finemet". Different grades are produced under the designation "Nanophy". They notably have compositions of FeCuMSiB type in which M is a transition metal. One composition widely used is of the $Fe_{73.5}Cu_1Nb_3Si_xB_{22.5-x}$ type containing 13.5% or 16.5% silicon.

In this family, crystals of iron-silicon are embedded in a residual amorphous matrix. The crystals have dimensions of the order of a nanometre. Compared to the iron-nickel alloys, the nanocrystalline materials offer the advantage of having an induction at saturation that is much higher, of the order of 1.3 T instead of 0.7 T typically for Permalloy.

More recently, other nanocrystalline materials of FeMB type have also been developed. They generally contain more than 80% of iron, 7% of transition metal and the balance of boron. The materials of this family comprise nanocrystals of pure iron. Their induction at saturation is comparable to that of the Finemet family.

The nanocrystalline materials make it possible to benefit from certain advantages of the amorphous materials, notably their homogeneity. This is due, for the nanocrystalline materials, to a structure composed of very small crystals oriented randomly and distributed uniformly in an amorphous matrix and therefore without grain boundary.

The nanocrystalline materials are often produced in the form of strips that are wound to form closed magnetic cores, often called toroidal cores.

All of these materials and any other ferromagnetic material can of course be used in the context of the invention to produce the magnetic core 50. The choice of material is made as a function of the displacement currents likely to circulate in the stray capacitances of the component 30 and as a function of the risk of saturation of the magnetic core 50.

In-house tests have shown that ferromagnetic materials that have a relative maximum magnetic permeability greater than 100 provide an effect of reducing the displacement currents.

The nanocrystalline ferromagnetic materials have relative magnetic permeability values that are much higher (typically greater than 30 000) and are all the more effective.

More specifically, it is possible to define a complex relative magnetic permeability: $\mu_r = \mu_r' - j\mu_r''$. The real part $\mu_r'$ of the magnetic permeability represents the faculty to store magnetic energy, that is to say the inductance part of the impedance provided by the magnetic core. The imaginary part $\mu_r''$ of the magnetic permeability represents the magnetic losses and can be likened to a resistor dissipating energy in the form of heat.

Most of the manufacturers of magnetic cores give a numeric value for the relative magnetic permeability. This numeric value corresponds to the modulus of the complex relative magnetic permeability. For a given material, it is possible to find the real part and the imaginary part by performing an impedance measurement on a winding made around a magnetic core produced in the material concerned. More specifically:

$$\mu_r' = (I \cdot L_{eff})/(\mu_0 \cdot N^2 \cdot A)$$

$$\mu_r'' = (I \cdot (R_{eff} - R_\omega))/(\mu_0 \cdot N^2 \cdot \omega \cdot A)$$

In these two formulae: I represents the average magnetic length of the core used to perform the impedance measurement, $L_{eff}$ represents the measured inductance, N represents the number of turns of the winding used for the impedance measurement, A represents the surface of the section of the magnetic core, $R_{eff}$ represents the resistance equivalent to the magnetic losses, including the resistance of the winding alone, $R_\omega$ represents the resistance of the winding alone, $\mu_0$ represents the absolute permeability of the vacuum ($4\pi 10^{-7}$ H/m) and $\omega$ represents the angular frequency ($2\pi f$) at which the impedance measurement is performed. As for the numeric values given by the manufacturers, it will be possible to choose an angular frequency corresponding to a frequency of 10 kHz. The company Keysight Technologies whose head office is located in the United States of America: 1400 Fountaingrove Parkway Santa Rosa, CA 95403-1738, proposes a precise measurement method in a document: "Solution for Measuring Permittivity and Permeability with LCR Meters and Impedance Analysers" published on 3 Aug. 2014 and available on the date of filing of the present patent application at the address:

https://www.keysight.com/fr/en/assets/7018-06683/application-notes/5980-2862.pdf The placement of a magnetic core according to the invention makes it possible to attenuate the resonance of the disturbances described using FIG. 1. This resonance is due to a circuit of LC type in which the capacitance is the stray capacitance of the switching component and in which the inductance is that of the circuit to which the switching component belongs. By adding a magnetic core according to the invention, the resonance frequency of the disturbances is reduced and the complex part of the magnetic permeability makes it possible to attenuate the quality factor of the resonant circuit. These two parameters, reduction of the frequency and of the quality factor make it possible to greatly reduce the disturbances.

Although the imaginary part of the magnetic permeability is a function of the resonance frequency of the circuit as a whole, some manufacturers of ferromagnetic materials give a value specific to the material. For example, for certain nanocrystalline materials, there are values of the order of 90 000 for the real part and of the order of 20 000 for the imaginary part of the relative magnetic permeability.

In practice, in-house tests have shown that with an imaginary part of the magnetic permeability greater than 10, interesting results are already obtained.

Figure 4:
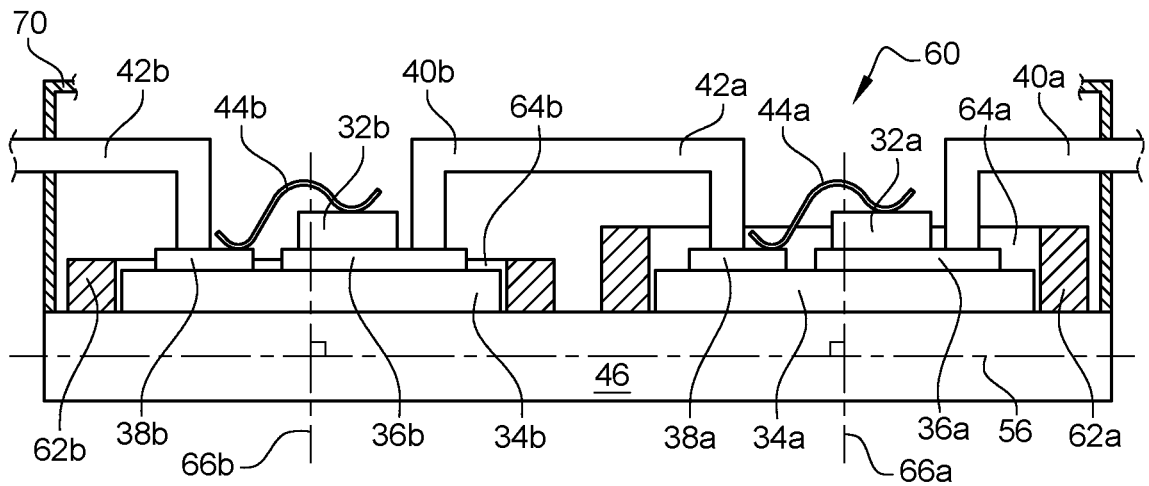
FIG. 4 represents a switching component comprising several elementary components.

Using FIG. 2, interest is focused on the stray capacitance or capacitances formed by the elementary component 32 and its metallization part 36. It is also possible to individually surround other metallization parts and notably the part 38 which can form a stray capacitance with the baseplate 46. FIG. 4 represents another example of switching component 60 in which there are two elementary components 32a and 32b, each on their substrate, respectively 34a and 34b, for each of the elementary components, the two metallization parts 36a, 38a and 36b, 38b, the two pins 40a, 42a and 40b, 42b, the legs 44a and 44b, and the baseplate 46 common to both the elementary components 32a and 32b. In this example, the elementary components are for example of different kinds, for example a transistor for the elementary component 32a and a diode for the elementary component 32b. The pins 42a and 40b are common. It is also possible to leave them separate. Other pins, not represented, can also be present in the component 60, for example when one of the elementary components is a forced switching component, or to link a flyback diode to a transistor as can be seen in FIG. 1. The switching component 60 further comprises a magnetic core 62a which, unlike the core 50, surrounds the substrate 34a, and a magnetic core 62b which surrounds the substrate 34b. Thus, all the metallization parts extending on the substrate 34a and that can form stray capacitances with the baseplate 46 are surrounded by the magnetic core 62a. Likewise, the metallization parts extending on the substrate 34b are surrounded by the magnetic core 62b. The magnetic cores 62a and 62b and their central void, respectively 64a and 64b extending along a respective axis 66a and 66b, have all the characteristics stated above for the magnetic core 50. Notably, the magnetic cores 62a and 62b are disposed in the component 60 in such a way that the path followed by the useful signal does not form a turn around each of the magnetic cores 62a and 62b.

Conventionally, the switching components on the market have an encapsulation 70 covering the substrates 34a and 34b and all the elements which are fixed therein on top of the baseplate 46, namely the metallization parts 36a, 36b, 38a and 38b, the elementary components 32a and 32b, the pins 40a, 40b, 42a, 42b and the legs 44a, 44b. Outside of the encapsulation, the following can be accessed: the baseplate 46, to fix a heat sink thereto and the ends of the pins 40a and 42b for connecting the component 60. The encapsulation 70 has been represented in FIG. 4. A same encapsulation exists also for the component 30 of FIG. 2.

The magnetic cores 62a and 62b are independent of one another. They have no common part. In fact, if common parts did exist, they could disturb one another, notably in case of saturation of one of the cores. In addition, the fact of keeping the magnetic cores 62a and 62b independent makes it possible to choose their characteristics independently of one another. It is also possible to choose different materials for the two magnetic cores 62a and 62b. It is possible to implement one magnetic core without air gap and one magnetic core with air gap. If one of the elementary components 32a and 32b is not sensitive or is very insensitive to the leak currents, it is possible to implement only a single magnetic core surrounding only the elementary component that is most sensitive to the leak currents. The magnetic core surrounding this elementary component is then perfectly suited to this component. By surrounding it as closely as possible, without surrounding the other component, its magnetic length is the shortest possible and its efficiency is all the better.

In FIG. 1, the load 18 operates in three-phase AC current mode. The inverter 14 is formed by three branches 14u, 14v and 14w each making it possible to generate one of the AC phases from the DC voltage delivered by the rectifier 12. Each of the branches comprises two transistors T, for example of IGBT type, each associated with a diode D, called flyback diode. It is possible to produce, in a same encapsulation, a switching component forming a branch of the inverter. More specifically, inside the encapsulation, the component comprises two transistors T and two diodes D borne by a same substrate or by distinct substrates but all borne by a same baseplate. The transistors T and the diodes D are connected inside the encapsulation by the metallization borne by the substrate if it is singular. The elementary components forming each of the diodes and each of the transistors can be each surrounded by a closed or open magnetic core.

Figure 5:
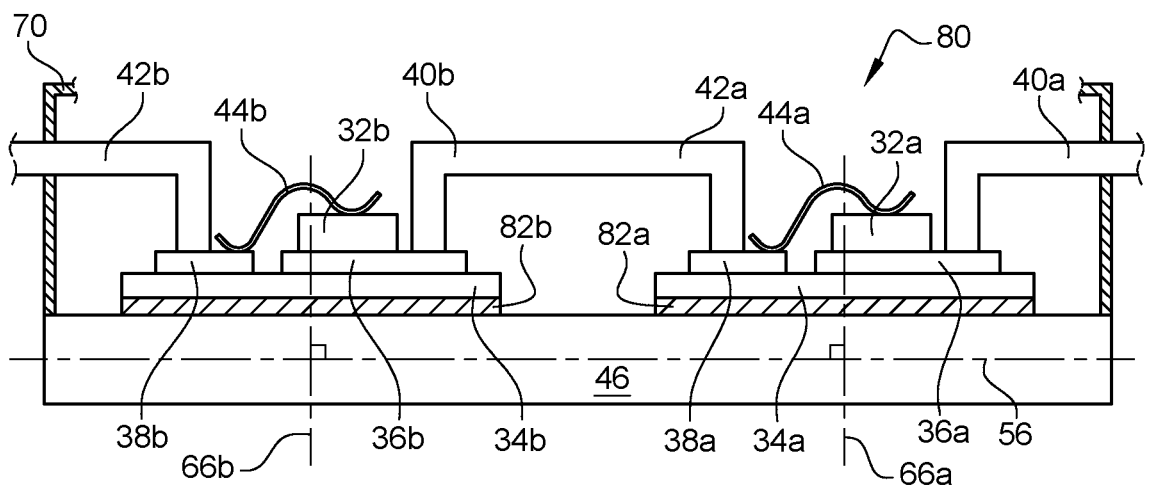
FIG. 5 represents a variant of the switching component of FIG. 4.

FIG. 5 represents a variant embodiment of the invention, in which, in a component 80, there are elements that are different from the component 60, namely the elementary components 32a and 32b each mounted on their respective substrate 34a and 34b, the metallization parts 36a, 38a, 36b and 38b, the pins 40a, 42a, 40b, 42b, the legs 44a and 44b, and the baseplate 46 common to the two elementary components 32a and 32b.

Unlike the component 60, the component 80 described in FIG. 5 makes it possible to illustrate another example of placement of the magnetic core that allows the production thereof to be simplified. Associated with each elementary component 32a and 32b, a magnetic core, respectively 82a and 82b, is here in plate form disposed between the substrate, respectively 34a, 34b, and the baseplate 46 that is common to the two elementary components 32a and 32b. The plate is continuous without void as in the preceding embodiments. As a variant, it is also possible to dispose the magnetic core in plate form under the baseplate 46 and, more specifically, between the baseplate 46 and a heat sink onto which the baseplate is intended to be fixed. In this variant, for the component 80, two magnetic cores 82a and 82b are each disposed facing an elementary component. The displacement current $I_D$ described above passes through the respective magnetic core 82a, 82b substantially at right angles of the plane in which the respective plate mainly extends. The displacement current $I_D$ induces a revolving magnetic induction in the plane of the plate inside the respective magnetic core 82a, 82b and in the part of the plate corresponding to the different magnetic cores with central void described above. The central part of the respective magnetic core 82a, 82b centred on the displacement current $I_D$ tends also to oppose the displacement current $I_D$.

As in the examples represented in FIGS. 2 and 4, in the embodiment represented in FIG. 5, the path followed by the switched electrical signal $I_C$ in the elementary component or components represented does not form, with the respective magnetic cores, a turn tending to generate an induced magnetic field in the magnetic core concerned.

The invention claimed is:

1. A switching component configured to switch an electrical signal, the switching component comprising:
    a substrate bearing one or several elementary components each ensuring the switching of the electrical signal,
    a baseplate onto which the substrate is fixed, the baseplate being configured to discharge heat emitted in the switchings of the switching component,
    two electrical conductors each connected to one of the elementary components and respectively ensuring the input and the output of the elementary component concerned for the signal to be switched,
    a magnetic core associated with each elementary component, and produced in a ferromagnetic material, each magnetic core surrounding each elementary component concerned without surrounding others of the elementary components, the magnetic cores being independent and having no common part, and the baseplate and each magnetic core being disposed in the component in such a way that a displacement current between the surrounded elementary component respective and the baseplate induces a magnetic induction in the magnetic core, and in such a way that the path followed by a conduction current of the electrical signal switched by the component does not form a turn around the magnetic core.

2. The switching component according to claim 1, wherein the magnetic core is produced in a ferromagnetic material having an imaginary part of relative magnetic permeability greater than 10.

3. The switching component according to claim 1, wherein the magnetic core is produced in a nanocrystalline ferromagnetic material.

4. The switching component according to claim 1, wherein the magnetic core comprises a central void surrounding the elementary component.

5. The switching component according to claim 4, wherein the magnetic core is closed.

6. The switching component according to claim 4, wherein the magnetic core is open.

7. The switching component according to claim 1, wherein the magnetic core is in the form of a plate disposed under the substrate.

8. A switching component configured to switch an electrical signal, the switching component comprising:
    a substrate bearing one or several elementary components each ensuring the switching of the electrical signal,
    a baseplate onto which the substrate is fixed, the baseplate being configured to discharge heat emitted in the switchings of the switching component,
    two electrical conductors each connected to one of the elementary components and respectively ensuring the input and the output of the elementary component concerned for the signal to be switched,
    a magnetic core associated with each elementary component and produced in a ferromagnetic material, each magnetic core being in a form of a plate specific to each elementary component arranged between the substrate and the baseplate, the magnetic cores being independent and having no common part, the baseplate and each magnetic core being disposed in the component in such a way that a displacement current between the surrounded elementary component respective and the baseplate induces a magnetic induction in the magnetic core, and in such a way that the path followed by a conduction current of the electrical signal switched by the component does not form a turn around the magnetic core.

\* \* \* \* \*